United States Patent
Sasamoto et al.

(10) Patent No.: US 9,798,229 B2
(45) Date of Patent: Oct. 24, 2017

(54) DESIGNING OF PHOTOMASK BLANK AND PHOTOMASK BLANK

(71) Applicant: SHIN-ETSU CHEMICAL CO., LTD., Tokyo (JP)

(72) Inventors: Kouhei Sasamoto, Joetsu (JP); Hideo Kaneko, Joetsu (JP); Yukio Inazuki, Joetsu (JP); Souichi Fukaya, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 156 days.

(21) Appl. No.: 14/801,051

(22) Filed: Jul. 16, 2015

(65) Prior Publication Data

US 2016/0033859 A1 Feb. 4, 2016

(30) Foreign Application Priority Data

Jul. 30, 2014 (JP) .................. 2014-155346
Jun. 3, 2015 (JP) .................. 2015-112959

(51) Int. Cl.
*G03F 1/38* (2012.01)
*G03F 1/50* (2012.01)
*G03F 1/84* (2012.01)

(52) U.S. Cl.
CPC .................. *G03F 1/50* (2013.01); *G03F 1/38* (2013.01); *G03F 1/84* (2013.01)

(58) Field of Classification Search
CPC .................. G03F 1/50; G03F 1/38; G03F 1/84
USPC ............................................. 430/5
See application file for complete search history.

(56) References Cited

U.S. PATENT DOCUMENTS

| | | | |
|---|---|---|---|
| 6,599,667 B2 | 7/2003 | Yusa et al. | |
| 7,166,392 B2 | 1/2007 | Ushida et al. | |
| 7,611,808 B2 | 11/2009 | Ushida et al. | |
| 7,771,893 B2 | 8/2010 | Yoshikawa et al. | |
| 8,007,964 B2 * | 8/2011 | Yoshikawa | G03F 1/46 430/5 |
| 2008/0305406 A1 | 12/2008 | Kominato et al. | |
| 2010/0143831 A1 | 6/2010 | Yoshikawa et al. | |
| 2013/0309601 A1 | 11/2013 | Fukaya et al. | |

FOREIGN PATENT DOCUMENTS

| | | |
|---|---|---|
| JP | 63-85553 A | 4/1988 |
| JP | 2001-312043 A | 11/2001 |
| JP | 3093632 U | 5/2003 |
| JP | 2003-195479 A | 7/2003 |
| JP | 2003-195483 A | 7/2003 |
| JP | 2007-33470 A | 2/2007 |
| JP | 2013-238777 A | 11/2013 |

OTHER PUBLICATIONS

Extended European Search Report dated Jun. 10, 2016, in European Patent Application No. 15176765.4.

* cited by examiner

*Primary Examiner* — Christopher Young
(74) *Attorney, Agent, or Firm* — Birch, Stewart, Kolasch & Birch, LLP

(57) ABSTRACT

A method for designing a photomask blank comprising a transparent substrate and an optical film thereon is provided. The photomask blank is processed into a transmissive photomask having a pattern of optical film such that the film pattern may be transferred when exposure light is transmitted by the photomask. The optical film is selected using a specific reflectance, which is equal to the reflectance divided by the film thickness, as an index.

35 Claims, 3 Drawing Sheets

DESIGNING OF PHOTOMASK BLANK AND PHOTOMASK BLANK

CROSS-REFERENCE TO RELATED APPLICATION

This non-provisional application claims priority under 35 U.S.C. §119(a) on Patent Application Nos. 2014-155346 and 2015-112959 filed in Japan on Jul. 30, 2014 and Jun. 3, 2015, respectively, the entire contents of which are hereby incorporated by reference.

TECHNICAL FIELD

This invention relates to a photomask blank which is processed into a photomask adapted to transfer a pattern by transmission of exposure light, and a method for designing a photomask blank.

BACKGROUND ART

For goals like a higher speed of operation and a saving of power consumption, a challenge to higher integration of large-scale integrated circuits continues. To meet increasing demands for shrinkage of circuit patterns, the advanced semiconductor microprocessing technology becomes important. For example, the technology for shrinkage of circuit-constructing wiring patterns and the technology for shrinkage of contact hole patterns for cell-constructing inter-layer connections become essential.

The advanced microprocessing technology relies on the photolithography using photomasks. The photomask is one important area of the miniaturization technology as are the exposure tool and resist material. To obtain a photomask capable of affording a fine-size wiring pattern or fine-size contact hole pattern as mentioned above, efforts are made to develop the technique of forming a more fine and accurate pattern on a photomask blank.

In order to form a high accuracy photomask pattern on a photomask substrate, it is of first priority to pattern a resist film on a photomask blank at high accuracy. Since the photolithography for microprocessing semiconductor substrates employs reduction projection, the size of a pattern formed on a photomask is about 4 times the size of a pattern formed on a semiconductor substrate, which does not mean that the accuracy of the pattern formed on the photomask is accordingly loosened. It is necessary that the photomask pattern be formed at a high accuracy.

At the present, the size of a circuit pattern written on a semiconductor substrate by photolithography is far smaller than the wavelength of exposure light. If reduction exposure is carried out using a photomask having a pattern which is a mere 4-time magnification of the circuit pattern, the photomask pattern is not faithfully transferred to the resist film due to impacts such as interference of exposure light.

Super-resolution masks addressing the problem include OPC masks in which the so-called optical proximity correction (OPC), i.e., the technology for correcting the optical proximity effect to degrade transfer properties is applied to photomasks and phase shift masks which cause a phase shift of 180° between adjacent pattern features to establish a sharp intensity distribution of incident light. For example, in some OPC masks, an OPC pattern (hammer head, assist bar or the like) having a size of less than half of a circuit pattern is formed. The phase shift masks include halftone, Levenson and chromeless types.

In general, a photomask pattern is formed by starting with a photomask blank having a light-shieldable film on a transparent substrate, forming a photoresist film on the photomask blank, exposing the photoresist film to light or electron beam (EB) to write a pattern, and developing the photoresist film to form a photoresist pattern. Then, with the photoresist pattern made mask, the light-shieldable film is etched to form the photomask pattern. To obtain a fine photomask pattern, it is effective to reduce the thickness of a photoresist film (i.e., thinner resist film) for the following reason.

If only a resist pattern is shrunk without reducing the thickness of a resist film, the resist pattern functioning as the etching mask for the light-shieldable film has a higher aspect ratio (ratio of resist film thickness to pattern width). In general, as the aspect ratio of resist pattern becomes higher, the pattern profile is more likely to degrade. Then the accuracy of pattern transfer to the light-shieldable film via the resist pattern as the etch mask is reduced. In extreme cases, the resist pattern partially collapses or strips off, resulting in pattern dropouts. In association with the shrinkage of a photomask pattern, it is necessary that the resist film used as the etching mask during patterning of a light-shieldable film is thinned to prevent the aspect ratio from becoming too high. An aspect ratio of up to 3 is generally recommended. To form a resist pattern having a feature width of 70 nm, for example, a resist film thickness of up to 210 nm is preferable.

For the light-shieldable film which is etched using the pattern of photoresist as an etch mask, on the other hand, a number of materials have been proposed. In particular, neat chromium films and chromium compound films containing chromium and at least one of nitrogen, oxygen and carbon are generally used as the light-shieldable film material. For example, Patent Documents 1 to 3 disclose photomask blanks wherein chromium compound films are formed as the light-shieldable film having light shielding properties necessary for the photomask blank for use in ArF excimer laser lithography.

The light-shieldable film in the form of chromium compound film is generally patterned by oxygen-containing chlorine dry etching, during which an organic film, typically photoresist film can be frequently etched to a noticeable extent. If the light-shieldable film in the form of chromium compound film is etched with a relatively thin resist film made mask, the resist is damaged during the etching so that the resist pattern is deformed. It is then difficult to accurately transfer the resist pattern to the light-shieldable film.

The attempt to endow the photoresist or organic film with high resolution and high patterning accuracy as well as etch resistance encounters a technical barrier. The photoresist film must be reduced in thickness for the goal of high resolution whereas thinning of the photoresist film must be limited for the purpose of ensuring etch resistance during etching of the light-shieldable film. As a result, there is a tradeoff relationship between high resolution/patterning accuracy and etch resistance.

To mitigate the load to the photoresist to enable film thickness reduction for eventually forming a photomask pattern of higher accuracy, the construction (including thickness and composition) of a light-shieldable film to be patterned must be ameriolated.

As to light-shieldable film materials, a number of studies have been made. For example, Patent Document 4 discloses a metal film as the light-shieldable film for ArF excimer laser lithography. Specifically, tantalum is used as the light-shieldable film and tantalum oxide used as the antireflective film. To mitigate the load applied to the photoresist during etching of these two layers, the layers are etched with a fluorine base gas plasma which causes relatively few damages to the photoresist. Even though such etching conditions are chosen, when two layers, light-shieldable film and antireflective film are etched using only the photoresist as etch mask, the mitigation of the load to the photoresist is limited. It is difficult to fully meet the requirement to form a fine size photomask pattern at a high accuracy.

As discussed above, the prior art photomask blank structure is difficult to fully meet the requirement to form a fine size photomask pattern on the light-shieldable film at a high accuracy. The problem becomes more serious with the photolithography using exposure light of shorter wavelength and requiring higher resolution, typically light with a wavelength of up to 200 nm (e.g., ArF excimer laser 193 nm, $F_2$ laser 157 nm).

As the light-shieldable film exhibiting a high etch rate during chlorine base dry etching that enables to mitigate the load to the photoresist for eventually forming a fine size photomask pattern at high accuracy, Patent Document 5 describes a light-shieldable film based on chromium and having light elements O and N added thereto, and Patent Document 6 describes a chromium compound film based on chromium and having a low melting metal such as Sn or In added thereto.

On the other hand, defect inspection on a photomask blank is generally carried out based on reflection by the blank. To detect defects of microscopic size, inspection light of shorter wavelength must be used. Light of wavelength 257 nm is currently used. To ensure accurate defect inspection on photomask blanks for ArF excimer laser lithography, a reflectance of the order of 10 to 20% with respect to light of this wavelength is necessary.

Nevertheless, a film of light element-containing chromium compound tends to have an increased transmittance and a reduced reflectance in the wavelength region of at least 200 nm. On alignment of a photomask utilizing transmitted or reflected light in the wavelength region of at least 400 nm for the reading of an alignment mark, there arises a problem of unstable alignment. A thick film is used to gain a necessary optical density, but is disadvantageous for reducing the feature size.

As the content of light elements increases, the light-shieldable film becomes less conductive. In the advanced technology where it is critical to reduce the feature size of a pattern transferred from a photomask to a wafer, the EB writing now takes the mainstream position in patterning a resist film during the manufacture of a photomask, as a replacement for the laser beam writing. For EB emission, a high accelerating voltage of 50 keV is employed in order to enable further miniaturization. There is a tendency of reducing the sensitivity of resist to achieve a higher resolution, while a remarkable leap of the current density from 40 $A/cm^2$ to 400 $A/cm^2$ is attempted from the aspect of productivity enhancement. Thus, the chromium compound film whose light element content is increased to gain a higher etch rate experiences a charge buildup during exposure of resist to EB, inviting a loss of imaging accuracy (increase of CD, shift of imaging position).

CITATION LIST

Patent Document 1: JP-A 2003-195479
Patent Document 2: JP-A 2003-195483
Patent Document 3: JP-U 3093632
Patent Document 4: JP-A 2001-312043
Patent Document 5: JP-A 2007-033470
Patent Document 6: JP-A 2013-238777
Patent Document 7: JP-A S63-85553

DISCLOSURE OF INVENTION

An object of the invention is to provide a photomask blank having an optical film of reduced thickness, which can mitigate the load to photoresist during etching of the optical film through the photoresist, while maintaining optical properties necessary as a light-shieldable film and a reflectance necessary for defect inspection and high accuracy alignment in the reading of an alignment mark. Another object is to provide a photomask blank which is effective for preventing any charge buildup during exposure of photoresist to EB and enables high accuracy imaging with EB. A further object is to provide a method for designing such a photomask blank.

For the goal of accurately forming a pattern of finer size, the chromium film used as the light-shielding film in a photomask blank must be made as thin as possible and tailored to have a high etch rate without losing a necessary degree of light shielding. Addition of light elements to chromium is effective for increasing the etch rate. In the photomask blank on which a pattern is formed using exposure light of wavelength 200 nm or shorter, the chromium film experiences a lowering of reflectance and an increase of transmittance at a wavelength which ranges from the wavelength of exposure light to 500 nm. Since the photomask having a chromium film is then inhibited from effective mask alignment, the chromium film must be made thicker to acquire a necessary optical density. Further, the chromium film becomes less conductive as a result of addition of light elements.

Regarding a photomask blank for a transmissive photomask, the inventors have found the following. The effective optical density of an optical film can be increased by increasing the reflectance to exposure light and light of longer wavelength than the exposure light. When a conductive reflecting film composed mainly of a metal and having a high specific reflectance (given as the reflectance divided by the film thickness) is used along with a light-shielding film as the optical film in the photomask blank, a high etch rate is acquired, and reflectance and optical density are efficiently increased without an extra increase of film thickness. By using the specific reflectance, given as the reflectance divided by the film thickness, as an index, and applying it to the design of a photomask blank having an optical film, the optical film compliant with the foregoing requirements can be efficiently selected.

When the conductive reflecting film is disposed remote from the transparent substrate with respect to the light-shielding film, preferably contiguous to the light-shielding film, the reflectance of the reflecting film on the outer surface (surface side remote from the substrate) is effectively increased. When the conductive reflecting film is the outermost layer of the photomask blank, this mitigates any charge buildup during EB writing of a photoresist film formed on the outermost layer of the photomask blank. The invention is predicated on this finding.

In one aspect, the invention provides a method for designing a photomask blank, the photomask blank comprising a transparent substrate and an optical film thereon having a reflectance and a thickness, the photomask blank being processed into a transmissive photomask having a pattern of optical film such that the film pattern may be transferred when exposure light is transmitted by the photomask, the method comprising selecting the optical film using a specific reflectance, which is equal to the reflectance divided by the film thickness, as an index.

In a preferred embodiment, the photomask blank comprises a transparent substrate, a light-shielding film, and a conductive reflecting film composed mainly of a metal, and the conductive reflecting film is included in the optical film, and a film having on its surface opposed to the light-shielding film a specific reflectance of at least 2.5%/nm, which is equal to the reflectance divided by the film thickness (nm), with respect to light of a predetermined wavelength which ranges from the wavelength of exposure light to 500 nm, and a sheet resistivity of up to 2,000 Ω/□ is selected as the conductive reflecting film.

In another aspect, the invention provides a photomask blank which is processed into a photomask comprising a transparent substrate and a pattern of film including a light-shielding region and a light-transmitting region with respect to exposure light with a wavelength of up to 200 nm, such that the film pattern may be transferred when exposure light is transmitted by the light-transmitting region of the photomask, the photomask blank comprising a transparent substrate, a light-shielding film, and a conductive reflecting film composed mainly of a metal, the conductive reflecting film having on its surface opposed to the light-shielding film a specific reflectance of at least 2.5%/nm, which is equal to the reflectance divided by the film thickness (nm), with respect to light of a predetermined wavelength which ranges from the wavelength of exposure light to 500 nm, and a sheet resistivity of up to 2,000 Ω/□.

In a preferred embodiment, the conductive reflecting film has a thickness of up to 10 nm; and the conductive reflecting film comprises at least 40 atom % of the metal and up to 15 atom % in total of nitrogen and oxygen.

In another preferred embodiment, the light-shielding film is formed between the transparent substrate and the conductive reflecting film.

Preferably, the conductive reflecting film is formed contiguous to the light-shielding film. Also preferably, the conductive reflecting film is formed as an outermost layer on the blank remote from the substrate.

In a preferred embodiment, any metal-containing film included in the photomask blank has a total optical density of at least 2.0.

The photomask blank may further comprise another optical film between the substrate and the light-shielding film. The other optical film is typically a phase shift film. Preferably, the combination of the light-shielding film and the phase shift film has a total optical density of at least 2.0.

Most often, the metal is chromium.

ADVANTAGEOUS EFFECTS OF INVENTION

For a photomask blank which maintains a sufficient optical density at exposure wavelength and a sufficient reflectance in a wavelength region longer than the exposure wavelength, has a light-shielding film of reduced thickness, and restrains any charge buildup during EB writing of photoresist, an optimum optical film, typically conductive reflecting film can be efficiently selected.

In conjunction with a photomask blank which is processed into a photomask such that a fine size pattern may be transferred when exposure light is transmitted by the photomask, if a conductive reflecting film having a specific reflectance of at least 2.5%/nm is provided, then a photomask blank having on a transparent substrate an optical film having a necessary optical density, a high reflectance and a reduced thickness is available.

According to the invention, a photomask blank having a high reflectance to exposure light and light of longer wavelength than the exposure light and a high conductivity is provided. This enables accurate alignment during the manufacture and use of a photomask and mitigates any charge buildup in the photomask blank during EB writing of a photoresist film. There is available a photomask blank from which a photomask pattern of fine size can be formed at a high accuracy.

DESCRIPTION OF PREFERRED EMBODIMENTS

Figure 1:
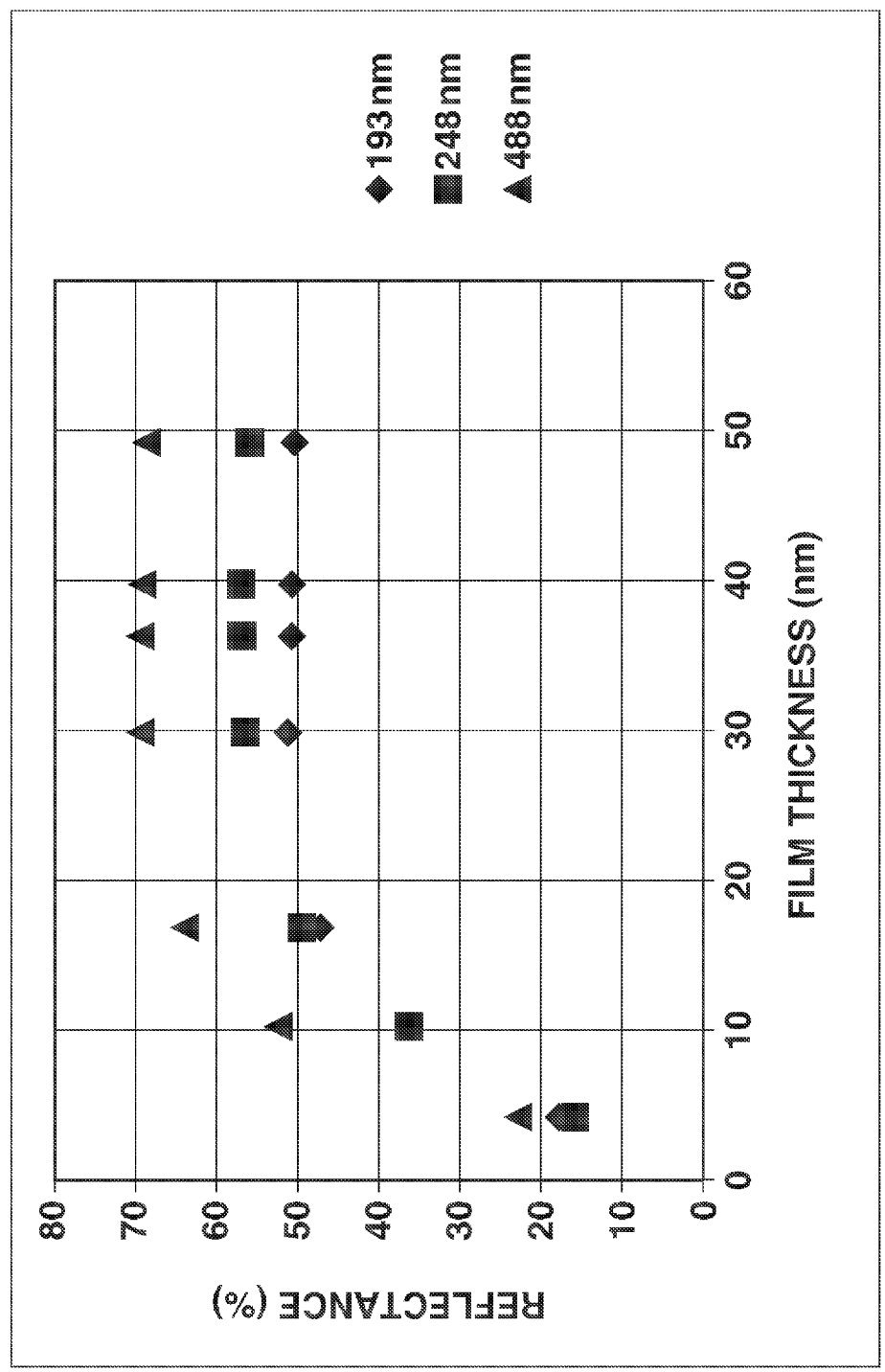
FIG. 1 is a diagram showing the thickness versus the reflectance on the surface side of a metallic chromium film in Example 1.

As used herein, the term "specific reflectance" of a film is defined, with the proviso that the film has a reflectance (%) with respect to light of a predetermined wavelength and a thickness (nm), as the reflectance divided by the thickness. The term "conductive" is electroconductive. The term "light-shieldable" means opaque or semi-transmissive.

One embodiment of the invention is a photomask blank which is processed into a photomask comprising a transparent substrate and a pattern of film thereon, the film pattern including a light-shielding region and a light-transmitting region with respect to exposure light with a wavelength of up to 200 nm, wherein the film pattern may be transferred when exposure light is transmitted by the light-transmitting region of the photomask. The preferred embodiment is a photomask blank comprising a transparent substrate, a light-shielding film, and a conductive reflecting film composed mainly of a metal and having a reflectance and a thickness, wherein the conductive reflecting film has on its surface opposed to the light-shielding film a specific reflectance of at least 2.5%/nm, which is equal to the reflectance divided by the thickness (nm) of the film, with respect to light of a predetermined wavelength which ranges from the wavelength of exposure light to 500 nm. Typical examples of the predetermined wavelength include 193 nm (ArF excimer laser) and 157 nm ($F_2$ laser) as the exposure light wavelength, 257 nm as the defect inspection wavelength, and 405 nm (solid-state laser diode) as one example of the alignment mark reading wavelength.

There is thus provided a photomask blank having a light-shieldable film having a reduced thickness, good conductivity, and a high etch rate, that is, an optical film having a light shielding function. The conductive reflecting film is composed mainly of a metal which is typically selected from among transition metals, silicon (Si), and germanium (Ge), preferably from among chromium (Cr), zirconium (Zr), tantalum (Ta), titanium (Ti), molybdenum (Mo), tungsten (W), iron (Fe), nickel (Ni), cobalt (Co), aluminum (Al), and mixtures thereof, and most preferably chromium.

The light-shieldable film composed mainly of chromium has an etch rate on oxygen-containing chlorine base dry etching which rate may be increased by adding a light element. This enables etching of the light-shieldable film at a high rate and thus mitigates the load applied to the photoresist, typically chemically amplified resist serving as a mask during the etching.

However, in the steps of manufacture and use of a photomask, it is a common practice to use light of longer wavelength than the exposure light in the detection of an alignment mark. When a light element is added to a light-shielding film composed mainly of a metal, typically chromium, the film is increased in transmittance, but decreased in reflectance with respect to light with a wavelength of at least 200 nm, which is deleterious in that the alignment in the above steps becomes difficult.

Also, when a light element is added to a light-shielding film composed mainly of a metal, typically chromium, the film is increased in resistivity or becomes less conductive. As a result, a charge buildup may occur during EB writing of photoresist, inviting a drop of writing accuracy. Particularly when oxygen is added, the film shows a remarkable increase of resistivity and almost becomes an insulating film.

Provided that a plate or film-shaped material has an absorbance α, a reflectance "r", and a transmittance "t" when light is incident on the material in a normal direction to its surface, i.e., thickness direction, these parameters meet the equation: $1=\alpha+r+t$. When it is desired to increase optical density, transmittance must be reduced, and hence, from the equation: $t=1-\alpha-r$, absorbance and reflectance must be increased.

In the photomask blank having a conductive reflecting film according to the invention, a conductive reflecting film composed mainly of a metal and having on its surface opposed to the light-shielding film a specific reflectance of at least 2.5%/nm, which is equal to the reflectance divided by the film thickness (nm), with respect to light of a predetermined wavelength which ranges from the wavelength of exposure light to 500 nm, is used along with the light-shielding film. The film has a reduced thickness, conductivity and light-shielding properties.

From the aspects of reducing film thickness, increasing reflectance and suppressing any charge buildup during EB writing of resist, it is preferred that the conductive reflecting film be disposed on the surface of the light-shielding film which is remote from the substrate, that is, on the upper surface of the light-shielding film and near a photoresist film which will be formed thereon. Differently stated, the light-shielding film is disposed between the substrate and the conductive reflecting film. It is also preferred from the aspects mentioned above that the conductive reflecting film be formed contiguous to the light-shielding film. Further preferably the conductive reflecting film is formed as an outermost layer on the photomask blank remote from the substrate. From the aspect of suppressing any charge buildup during EB writing of resist, the conductive reflecting film should preferably have a sheet resistivity of up to 2,000 ohm/square (Ω/□), more preferably up to 1,500 Ω/□, and even more preferably up to 1,000 Ω/□. When the EB has a current density of 400 A/cm$^2$, for example, as long as the outermost layer of the photomask blank has a sheet resistivity of up to 1,000 Ω/□, the layer is fully effective for suppressing any charge buildup during EB writing. With this taken into account, the conductive reflecting film of the photomask blank should preferably have a thickness of at least 2 nm, more preferably at least 4 nm.

In forming the conductive reflecting film, it is preferred to carry out deposition in an inert gas alone without using a reactive gas such as nitrogen ($N_2$) gas or oxygen ($O_2$) gas because a higher conductivity and reflectance are necessary. In forming the conductive reflecting film, however, a reactive gas may be added for adjusting the stress of the film being deposited as long as the process does not proceed to the transition phase where a compound having an extremely low deposition rate is deposited. Since oxygen gas causes a substantial reduction of the conductivity of a sputtered film, oxygen gas need not be used, or if used, the sputtering gas containing oxygen is preferably controlled such that the conductive reflecting film may have an oxygen content of up to 15 atom %. Also preferably, the conductive reflecting film has the content of light elements, e.g., the total content of oxygen, nitrogen and carbon which is lower than the content of light elements in the light-shielding film. Specifically the total content of nitrogen and oxygen in the conductive reflecting film is preferably less than 40 atom %, more preferably up to 20 atom %, and most preferably up to 15 atom %.

The metal in the conductive reflecting film is preferably at least one element selected from among Cr, Zr, Ta, Ti, Mo, W, Fe, Ni, Co, Al, and Si, and most preferably Cr. The conductive reflecting film preferably has a total content of metals of at least 60 atom %, more preferably at least 80 atom %, and most preferably at least 85 atom %. The conductive reflecting film may be composed of a metal alone or a metal compound wherein a light element selected from oxygen, nitrogen and carbon, especially a light element selected from oxygen and nitrogen is added to a metal.

The conductive reflecting film preferably has a thickness of up to 10 nm. With respect to the etch rate on oxygen-containing chlorine base dry etching, for example, a metal film, typically metallic chromium film has a low etch rate as compared with a metal compound film, typically light element-containing chromium compound film. Then the conductive reflecting film is preferably as thin as possible. In order for the conductive reflecting film to exert its effect to a full extent, its thickness should preferably be at least 2 nm.

The light-shielding film used along with the conductive reflecting film is a film that contributes most to the light shielding function (i.e., a film having the highest optical density) among the optical films on the photomask blank. The light-shielding film is preferably composed of a metal compound wherein a light element selected from oxygen, nitrogen and carbon, especially a light element selected from oxygen and nitrogen is added to a metal. The metal of this metal compound is preferably selected from the metals enumerated for the conductive reflecting film, and more preferably the same metal as in the conductive reflecting film.

The light-shielding film has a metal content which is preferably at least 15 atom %, more preferably at least 20 atom % and preferably up to 40 atom %, more preferably up to 37 atom %. The oxygen content of the light-shielding film is preferably at least 0.1 atom %, more preferably at least 3 atom % and preferably up to 65 atom %, more preferably up to 60 atom %. The nitrogen content of the light-shielding film is preferably at least 15 atom %, more preferably at least 30 atom % and preferably up to 65 atom %, more preferably up to 60 atom %. Further the total content of nitrogen and oxygen in the light-shielding film is preferably more than 15 atom %, more preferably at least 30 atom %. The light-shielding film has a thickness which is preferably at least 30 nm, more preferably at least 40 nm and preferably up to 70 nm, more preferably up to 60 nm.

Preferably, the metal-containing film or films in the photomask blank have an optical density in total of at least 2.0, more preferably at least 3.0.

When a photomask is intended for use in photolithography using exposure light having a relatively short wavelength and requiring high resolution, specifically light having a wavelength of 200 nm or shorter (e.g., ArF excimer laser light: 193 nm, $F_2$ laser light: 157 nm), microscopic defects on the photomask are detected by directing inspection light in the wavelength region of 200 nm or longer. Now that the photomask blank is constructed as described just above, when light of the inspection wavelength is directed thereto, a sufficient reflectance to ensure accurate defect inspection on the photomask is obtainable. In addition, since the sheet resistivity is reduced, any charge buildup during EB writing of photoresist is suppressed. Besides the defect inspection, a film included in the photomask blank is formed with an alignment mark for the positional control of the photomask. While light having a wavelength of 400 nm or longer is used in detecting the alignment mark, a sufficient reflectance is necessary for this detection. Now that the photomask blank is constructed as described just above, a sufficient reflectance for the detection of an alignment mark is obtainable. For both the inspection of mask defects and the detection of alignment marks, a reflectance of preferably at least 20%, more preferably at least 30%, and most preferably at least 35% is necessary.

In the embodiment of photomask blank wherein a conductive reflecting film is disposed as the outermost layer, the conductive reflecting film may be overlaid with a protective film having a thickness of up to 100 nm for reducing the resistivity of the photomask blank. When the photomask blank is processed into a photomask by forming a chemically amplified resist on the blank and imaging the resist with EB, the provision of an organic conductive film on top of the blank is effective for further suppressing the charge buildup during EB writing.

For releasing the charge on the surface of the photomask blank during the EB writing, the photomask blank mounted in an EB writing tool is connected at one edge to a ground terminal. For more effectively preventing defects from generating on the photomask blank during EB writing, preferably the resist on the edge of the blank is stripped off, then the charge is quickly removed by the action of the conductive reflecting film. In this case, for example, the resist on the edge of the photomask blank is stripped off, an organic conductive film is formed thereon, an edge portion of the organic conductive film is stripped off, whereby defect formation is effectively suppressed. Preferably the organic conductive film is formed contiguous to the conductive reflecting film, particularly at the edge portion of the photomask blank. For example, if the width of a stripped portion of the organic conductive film is narrower than the width of a stripped portion of the photoresist, the organic conductive film can be formed such that a portion thereof may be in direct contact with the conductive reflecting film. This arrangement is effective for defect prevention and charge buildup prevention.

As to connection of the ground terminal, the organic conductive film is formed to the edge of the photomask blank, the edge portion of the organic conductive film is not stripped, and the ground terminal of the EB writing tool is connected to the edge portion. Alternatively, the organic conductive film is omitted, and the ground terminal is connected to the conductive reflecting film.

For etching of the conductive reflecting film, a hard mask film is preferably formed on the conductive reflecting film. The provision of the hard mask film allows the photoresist to be thinner to comply with further reduction of pattern feature size. As a result of photoresist being made thinner, the time of EB writing is reduced, further suppressing a charge buildup.

Where chromium is used as the metal of the conductive reflecting film, especially the metal of the conductive reflecting film and light-shielding film, the hard mask film may be a film which is quickly etched on fluorine base dry etching, but has an extremely slow etch rate on chlorine base dry etching. Such a hard mask film is preferably a silicon-containing film, for example, silicon alone, or compounds containing silicon and at least one element selected from oxygen, nitrogen and carbon, or such compounds further containing a transition metal (other than chromium) such as Mo, Ta, W, Zr or Ti.

In a further embodiment, another optical film may be disposed between the transparent substrate and the light-shielding film. The other optical film is, for example, an antireflective film or a phase shift film, typically half-tone phase shift film. An etch stop film or etch mask film is also included in the other optical film as long as it is left on the photomask and functions as an optical film after the processing of the photomask blank into the photomask.

Where chromium is used as the metal of the conductive reflecting film, especially the metal of the conductive reflecting film and light-shielding film, the phase shift film is preferably a silicon-containing film, for example, silicon alone, or compounds containing silicon and at least one element selected from oxygen, nitrogen and carbon, or such compounds further containing a transition metal (other than chromium) such as Mo, Ta, W, Zr or Ti. In this embodiment, the thickness of the light-shielding film can be set further thinner than in the case of photomasks without phase shift film. As a result, the light-shielding film may be thinner than the conductive reflecting film. In this case, if the combination of the light-shielding film and phase shift film has a total optical density of at least 2.0, more preferably at least 3.0, then it is possible to ensure light shielding to the region of the photomask that requires light shielding.

According to the invention, a metal base thin film having a low content of light element, especially a Cr base thin film having a low content of light element is used as the conductive reflecting film, and disposed on the surface of a metal base light-shielding film, such as a Cr base light-shielding film which is remote from the transparent substrate. This arrangement provides a photomask blank that has a sufficient optical density at the exposure wavelength and a sufficient reflectance in the wavelength region which ranges from the exposure wavelength to 500 nm, for example, includes the light-shielding film of reduced thickness, and suppresses a charge buildup during EB writing of photoresist.

In designing a photomask blank, the photomask blank comprising a transparent substrate and an optical film thereon, the photomask blank being processed into a transmissive photomask having a pattern of optical film such that the film pattern may be transferred when exposure light is transmitted by the photomask, the optical film, typically conductive reflecting film, is selected using a specific reflectance, which is equal to the reflectance divided by the film thickness, as an index. This enables efficient selection of an optical film which is optimum for a photomask blank in that it has a sufficient optical density at the wavelength of exposure light, and a sufficient reflectance in the wavelength region from the wavelength of exposure light to 500 nm, for example, allows the light-shielding film to be reduced in thickness, and suppresses a charge buildup during EB writing of photoresist.

For example, to efficiently enhance the reflectance of a metallic chromium film with respect to exposure light (ArF excimer laser light) of wavelength 193 nm while maintaining the film thin, a conductive reflecting film may be designed to a film thickness of less than 30 nm. As long as a film having a specific reflectance of at least 2.5%/nm is selected as the conductive reflecting film which is deposited for the purpose of increasing reflectance, the reflectance can be advantageously increased relative to a percent increase of film thickness. Because of the metallic chromium film, the sheet resistivity is suppressed below 100 Ω/□ even at the thickness of 10 nm. When a photomask blank is constructed by depositing a conductive reflecting film in the form of a metallic chromium film having a specific reflectance of at least 2.5%/nm on the surface of the light-shielding film of a light element-containing chromium compound having a high etch rate which is disposed remote from the substrate, the photomask blank is endowed with light-shielding properties, reflectance and conductivity.

EXAMPLE

Examples and Comparative Example are given below by way of illustration and not by way of limitation.

Example 1

A quartz substrate of 152 mm squares and 6 mm thick was set in a DC magnetron sputtering system. A metallic chromium film of varying thickness was deposited on the substrate by using a metallic chromium target, feeding 20 sccm of Ar gas (inert gas) as the sputtering gas, and effecting DC magnetron sputtering for a different time. The metallic chromium films deposited in the inert gas alone were measured for thickness (nm) and reflectance (%) with respect to light of wavelength 193 nm, 248 nm, and 488 nm. The reflectance was plotted relative to the film thickness in the diagram of FIG. 1. A specific reflectance was computed by dividing the reflectance (%) by the film thickness (nm) and plotted relative to the film thickness in the diagram of FIG. 2.

Figure 2:
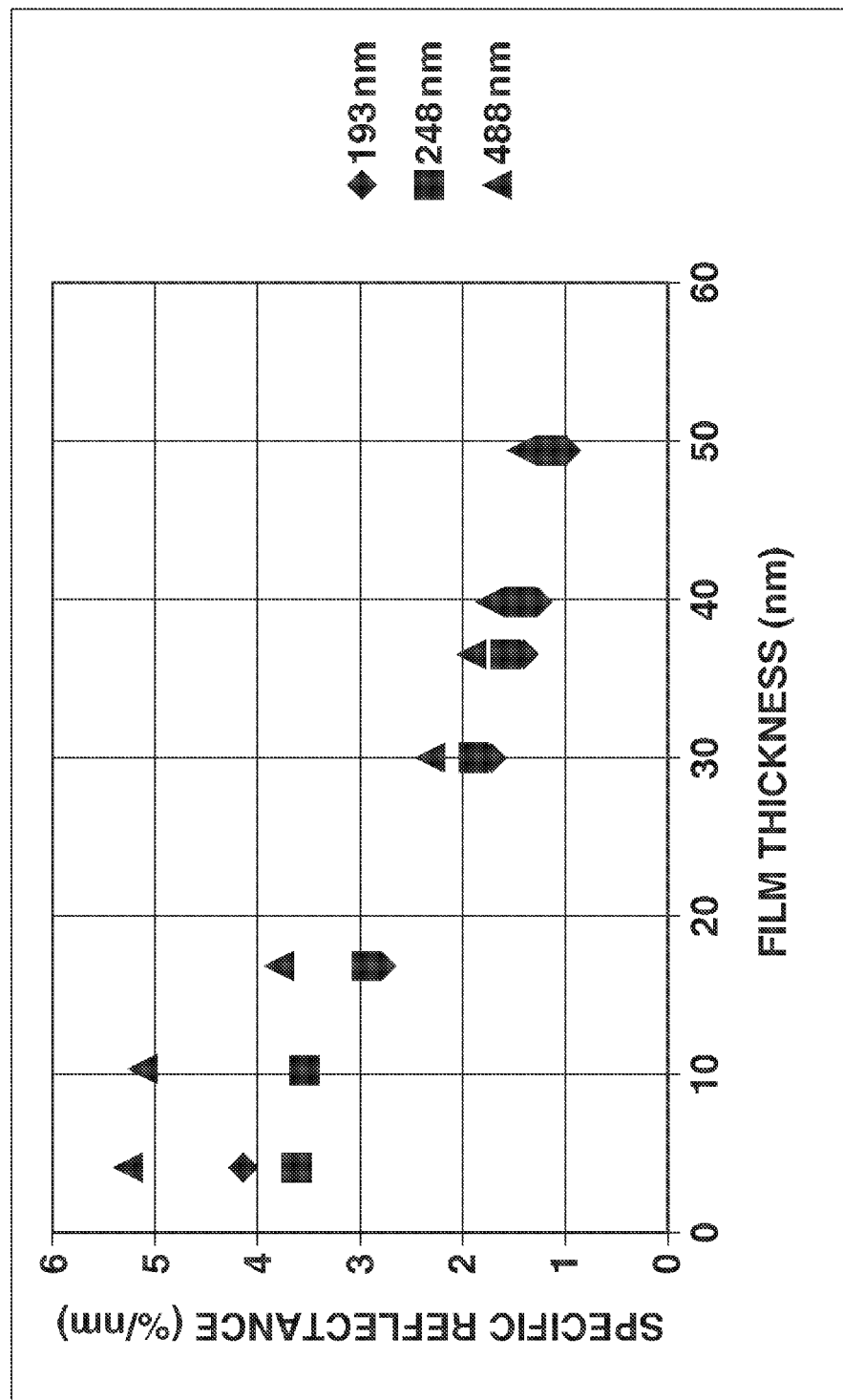
FIG. 2 is a diagram showing the thickness versus the specific reflectance (%/nm) of a metallic chromium film in Example 1.

As seen from FIG. 1, among the metallic chromium films, those films having a thickness of at least 30 nm have a constant reflectance independent of the film thickness. For those films having a thickness of less than 30 nm, the reflectance lowers as the film thickness decreases. For the purpose of enhancing the reflectance of a film while keeping it thin, it is recommended from FIGS. 1 and 2 to design a conductive reflecting film having a thickness of less than 30 nm. As long as a film having a specific reflectance of at least 2.5%/nm is selected as the conductive reflecting film which is deposited for the purpose of increasing reflectance, the reflectance can be advantageously increased relative to a percent increase of film thickness.

Figure 3:
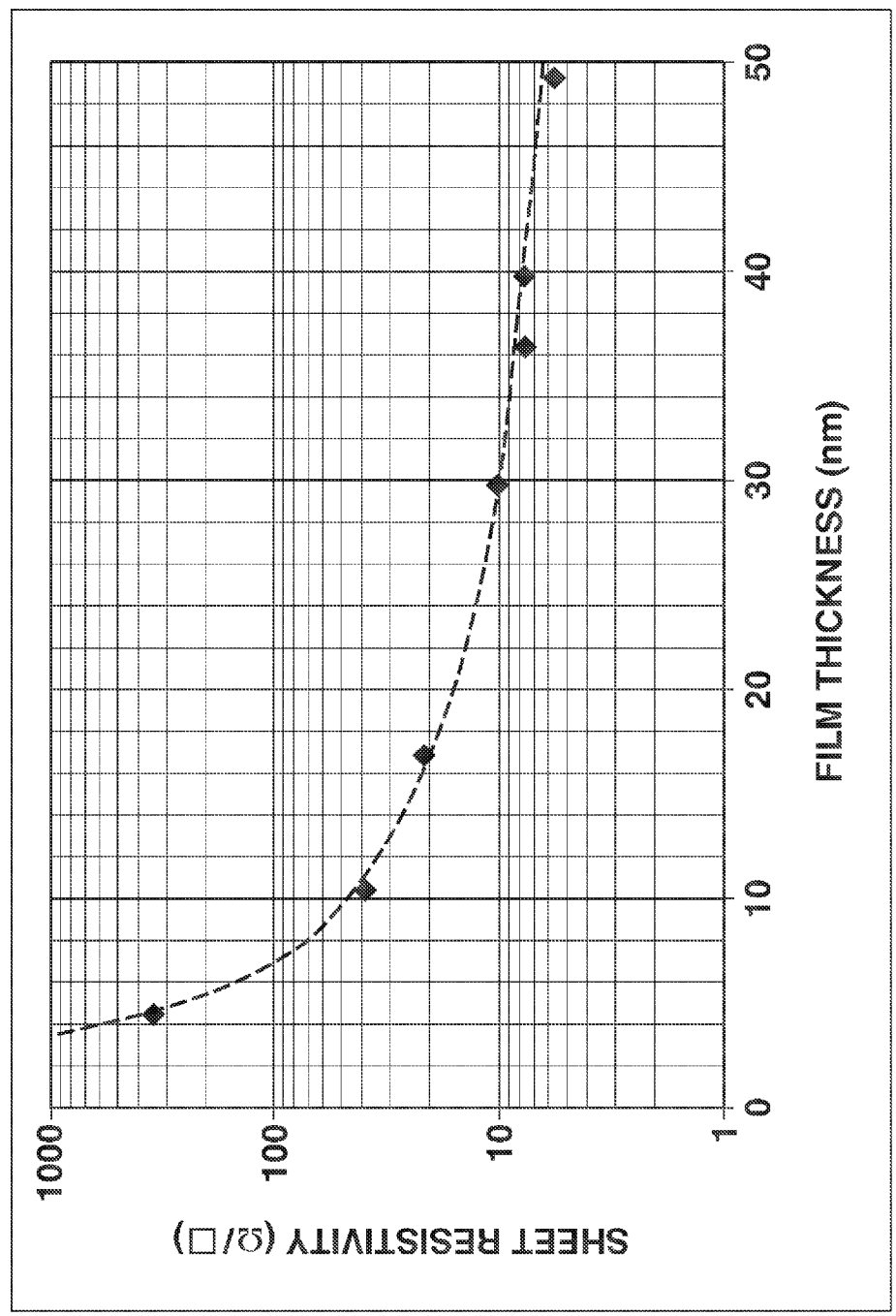
FIG. 3 is a diagram showing the thickness versus the sheet resistivity of a metallic chromium film in Example 1.

In the diagram of FIG. 3, the sheet resistivity of the metallic chromium films is plotted relative to the thickness. Since the film is made of metallic chromium, the sheet resistivity is suppressed below 100 Ω/□ even at the thickness of 10 nm. It is noted that the sheet resistivity is measured by a four-terminal resistivity meter (Loresta GP MCP-T610 by Mitsubishi Chemical Analytech Co., Ltd.).

Example 2

A quartz substrate of 152 mm squares and 6 mm thick was set in a DC magnetron sputtering system. A half-tone phase shift film of MoSiON having a thickness of 72 nm, a transmittance of 6.0% to exposure light (wavelength 193 nm), and a phase shift of 177° was deposited on the substrate. Next, a CrNC film of 46 nm thick was deposited as a light-shielding film on the phase shift film by using a metallic chromium target, feeding 50 sccm of nitrogen gas and 5 sccm of methane gas as reactive gas and 10 sccm of Ar gas as inert gas, and effecting DC magnetron sputtering. Further, a CrN film (Cr:N=9:1 in atomic ratio) of 3 nm thick was deposited as a conductive reflecting film on the light-shielding film by using a metallic chromium target, feeding 35 sccm of nitrogen gas as reactive gas and 20 sccm of Ar gas as inert gas, and effecting DC magnetron sputtering.

The conductive reflecting film had a reflectance of 26.9% with respect to exposure light (wavelength 193 nm), a reflectance of 38.2% with respect to light of wavelength 500 nm, and a sheet resistivity of 598 Ω/□.

Comparative Example 1

A quartz substrate of 152 mm squares and 6 mm thick was set in a DC magnetron sputtering system. A half-tone phase shift film of MoSiON having a thickness of 72 nm, a transmittance of 6.0% to exposure light (wavelength 193 nm), and a phase shift of 177° was deposited on the substrate. Next, a CrNC film of 46 nm thick was deposited as a light-shielding film on the phase shift film by using a metallic chromium target, feeding 50 sccm of nitrogen gas and 5 sccm of methane gas as reactive gas and 10 sccm of Ar gas as inert gas, and effecting DC magnetron sputtering. Further, a CrON film (Cr:O:N=5:6:3 in atomic ratio) of 3 nm thick was deposited as a conductive reflecting film on the light-shielding film by using a metallic chromium target, feeding 50 sccm of nitrogen gas and 10 sccm of oxygen gas as reactive gas and 10 sccm of Ar gas as inert gas, and effecting DC magnetron sputtering.

The conductive reflecting film had a reflectance of 21.2% with respect to exposure light (wavelength 193 nm), a reflectance of 35.9% with respect to light of wavelength 500 nm, and a sheet resistivity as high as 38,200 Ω/□. With this film construction unchanged, an attempt was made to coat the photomask blank with an EB lithography resist and patternwise expose the resist with EB, but failed in the desired accuracy of imaging position because the substrate is electrically charged due to the high sheet resistivity.

It is evident from these results that when a photomask blank is constructed by depositing a conductive reflecting film in the form of a metallic chromium film having a specific reflectance of at least 2.5%/nm on the surface of the light-shielding film of a light element-containing chromium compound having a high etch rate which is disposed remote from the substrate, the photomask blank is endowed with light-shielding properties, reflectance and conductivity.

While the invention has been described with reference to a preferred embodiment, various changes may be made without departing from the scope of the invention. It is intended that the invention not be limited to the particular embodiment disclosed as the best mode contemplated for carrying out this invention, but that the invention will include all embodiments falling within the scope of the appended claims.

Japanese Patent Application Nos. 2014-155346 and 2015-112959 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for designing a photomask blank, the photomask blank comprising a transparent substrate and an optical film thereon having a reflectance and a thickness, the photomask blank being processed into a transmissive photomask having a pattern of optical film such that the film pattern may be transferred when exposure light is transmitted by the photomask, the method comprising selecting the optical film using a specific reflectance, which is equal to the reflectance divided by the film thickness, as an index.

2. The method of claim 1 wherein the photomask blank comprises a transparent substrate, a light-shielding film, and a conductive reflecting film composed mainly of a metal, and the conductive reflecting film is included in the optical film, a film having on its surface opposed to the light-shielding film a specific reflectance of at least 2.5%/nm, which is equal to the reflectance divided by the film thickness (nm), with respect to light of a predetermined wavelength which ranges from the wavelength of exposure light to 500 nm, and a sheet resistivity of up to 2,000 $\Omega/\square$ is selected as the conductive reflecting film.

3. The method of claim 2 wherein the light-shielding film has a metal content of at least 15 atom % and up to 40 atom %, and the conductive reflecting film has a total content of metals of at least 60 atom %.

4. The method of claim 2 wherein the light-shielding film has a total content of nitrogen and oxygen of at least 30 atom %, and the conductive reflecting film has a total content of metals of at least 80 atom %.

5. The method of claim 2 wherein the conductive reflecting film has a thickness of up to 10 nm.

6. The method of claim 2 wherein the conductive reflecting film comprises up to 15 atom % in total of nitrogen and oxygen.

7. The method of claim 2 wherein the light-shielding film has a thickness of at least 30 nm.

8. The method of claim 2 wherein said predetermined wavelength includes wavelengths of 157 nm, 193 nm, 257 nm and 405 nm, and said film having said specific reflectance of at least 2.5%/nm with respect to light of all of said wavelengths is selected as the conductive reflecting film.

9. A photomask blank which is processed into a photomask comprising a transparent substrate and a pattern of film including a light-shielding region and a light-transmitting region with respect to exposure light with a wavelength of up to 200 nm, such that the film pattern may be transferred when exposure light is transmitted by the light-transmitting region of the photomask, the photomask blank comprising a transparent substrate, a light-shielding film having a metal content of at least 15 atom % and up to 40 atom %, and a conductive reflecting film having a total content of metals of at least 60 atom %, the conductive reflecting film having on its surface opposed to the light-shielding film a specific reflectance of at least 2.5%/nm, which is equal to the reflectance divided by the film thickness (nm), with respect to light of a predetermined wavelength which ranges from the wavelength of exposure light to 500 nm, and a sheet resistivity of up to 2,000 $\Omega/\square$.

10. The photomask blank of claim 9 wherein the conductive reflecting film has a thickness of up to 10 nm.

11. The photomask blank of claim 9 wherein the conductive reflecting film comprises up to 15 atom % in total of nitrogen and oxygen.

12. The photomask blank of claim 9 wherein the light-shielding film is formed between the transparent substrate and the conductive reflecting film.

13. The photomask blank of claim 9 wherein the conductive reflecting film is formed contiguous to the light-shielding film.

14. The photomask blank of claim 9 wherein the conductive reflecting film is formed as an outermost layer on the blank remote from the substrate.

15. The photomask blank of claim 12 wherein any metal-containing film included in the photomask blank has a total optical density of at least 2.0.

16. The photomask blank of claim 15, further comprising another optical film between the substrate and the light-shielding film.

17. The photomask blank of claim 16 wherein the other optical film is a phase shift film.

18. The photomask blank of claim 17 wherein the combination of the light-shielding film and the phase shift film has a total optical density of at least 2.0.

19. The photomask blank of claim 9 wherein the metal is chromium.

20. The photomask blank of claim 9 wherein the light-shielding film has a thickness of at least 30 nm.

21. The photomask blank of claim 9 wherein said predetermined wavelength includes all wavelengths of 157 nm, 193 nm, 257 nm and 405 nm, and the conductive reflecting film has said specific reflectance of at least 2.5%/nm with respect to light of all of said wavelengths.

22. A photomask blank which is processed into a photomask comprising a transparent substrate and a pattern of film including a light-shielding region and a light-transmitting region with respect to exposure light with a wavelength of up to 200 nm, such that the film pattern may be transferred when exposure light is transmitted by the light-transmitting region of the photomask, the photomask blank comprising a transparent substrate, a light-shielding film having a total content of nitrogen and oxygen of at least 30 atom %, and a conductive reflecting film having a total content of metals of at least 60 atom %, the conductive reflecting film having on its surface opposed to the light-shielding film a specific reflectance of at least 2.5%/nm, which is equal to the reflectance divided by the film thickness (nm), with respect to light of a predetermined wavelength which ranges from the wavelength of exposure light to 500 nm, and a sheet resistivity of up to 2,000 $\Omega/\square$.

23. The photomask blank of claim 22 wherein the conductive reflecting film has a thickness of up to 10 nm.

24. The photomask blank of claim 22 wherein the conductive reflecting film comprises up to 15 atom % in total of nitrogen and oxygen.

25. The photomask blank of claim 22 wherein the light-shielding film is formed between the transparent substrate and the conductive reflecting film.

26. The photomask blank of claim 22 wherein the conductive reflecting film is formed contiguous to the light-shielding film.

27. The photomask blank of claim 22 wherein the conductive reflecting film is formed as an outermost layer on the blank remote from the substrate.

28. The photomask blank of claim 25 wherein any metal-containing film included in the photomask blank has a total optical density of at least 2.0.

29. The photomask blank of claim 28, further comprising another optical film between the substrate and the light-shielding film.

30. The photomask blank of claim 29 wherein the other optical film is a phase shift film.

31. The photomask blank of claim 30 wherein the combination of the light-shielding film and the phase shift film has a total optical density of at least 2.0.

32. The photomask blank of claim 22 wherein the metal is chromium.

33. The photomask blank of claim 22 wherein the light-shielding film has a thickness of at least 30 nm.

34. The photomask blank of claim 22 wherein the conductive reflecting film has a total content of metals of at least 80 atom %.

35. The photomask blank of claim 22 wherein said predetermined wavelength includes all wavelengths of 157 nm, 193 nm, 257 nm and 405 nm, and the conductive reflecting film has said specific reflectance of at least 2.5%/nm with respect to light of all of said wavelengths.

* * * * *